(12) United States Patent
Sekine et al.

(10) Patent No.: US 8,829,593 B2
(45) Date of Patent: Sep. 9, 2014

(54) SEMICONDUCTOR MEMORY DEVICE HAVING THREE-DIMENSIONALLY ARRANGED MEMORY CELLS, AND MANUFACTURING METHOD THEREOF

(75) Inventors: Katsuyuki Sekine, Yokohama (JP); Kensuke Takano, Yokohama (JP); Masaaki Higuchi, Yokkaichi (JP); Tetsuya Kai, Yokohama (JP); Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 803 days.

(21) Appl. No.: 12/726,952

(22) Filed: Mar. 18, 2010

(65) Prior Publication Data
US 2010/0237402 A1 Sep. 23, 2010

(30) Foreign Application Priority Data
Mar. 19, 2009 (JP) .................................. 2009-068963

(51) Int. Cl.
*H01L 29/792* (2006.01)
*H01L 21/336* (2006.01)
*H01L 29/423* (2006.01)
*H01L 27/115* (2006.01)
*H01L 29/788* (2006.01)

(52) U.S. Cl.
CPC .... *H01L 27/11578* (2013.01); *H01L 29/42332* (2013.01); *H01L 27/11582* (2013.01); *H01L 29/7881* (2013.01); *H01L 27/11551* (2013.01); *H01L 27/11556* (2013.01); *H01L 29/792* (2013.01); *H01L 29/7926* (2013.01)
USPC .... 257/324; 257/326; 257/330; 257/E21.409; 257/E29.309; 438/258

(58) Field of Classification Search
CPC .................... H01L 27/11568; H01L 21/02219
USPC .......... 257/324, E21.409, E29.309, 326, 330; 438/258
See application file for complete search history.

(56) References Cited

U.S. PATENT DOCUMENTS

| | | | |
|---|---|---|---|
| 2010/0013049 A1* | 1/2010 | Tanaka et al. | 257/532 |
| 2010/0044776 A1* | 2/2010 | Ishiduki et al. | 257/324 |
| 2010/0059811 A1 | 3/2010 | Sekine et al. | |

FOREIGN PATENT DOCUMENTS

JP 2007-266143 10/2007

OTHER PUBLICATIONS

U.S. Appl. No. 12/564,605, filed Sep. 22, 2009.

* cited by examiner

*Primary Examiner* — Lynne Gurley
*Assistant Examiner* — Vernon P Webb
(74) *Attorney, Agent, or Firm* — Finnegan, Henderson, Farabow, Garrett & Dunner, LLP

(57) ABSTRACT

A first select transistor is formed on a semiconductor substrate. Memory cell transistors are stacked on the first select transistor and connected in series. A second select transistor is formed on the memory cell transistors. The memory cell transistors include a tapered semiconductor pillar which increases in diameter from the first select transistor toward the second select transistor, a tunnel dielectric film formed on the side surface of the semiconductor pillar, a charge storage layer which is formed on the side surface of the tunnel dielectric film and which increases in charge trap density from the first select transistor side toward the second select transistor side, a block dielectric film formed on the side surface of the charge storage layer, and conductor films which are formed on the side surface of the block dielectric film and which serve as gate electrodes.

10 Claims, 14 Drawing Sheets

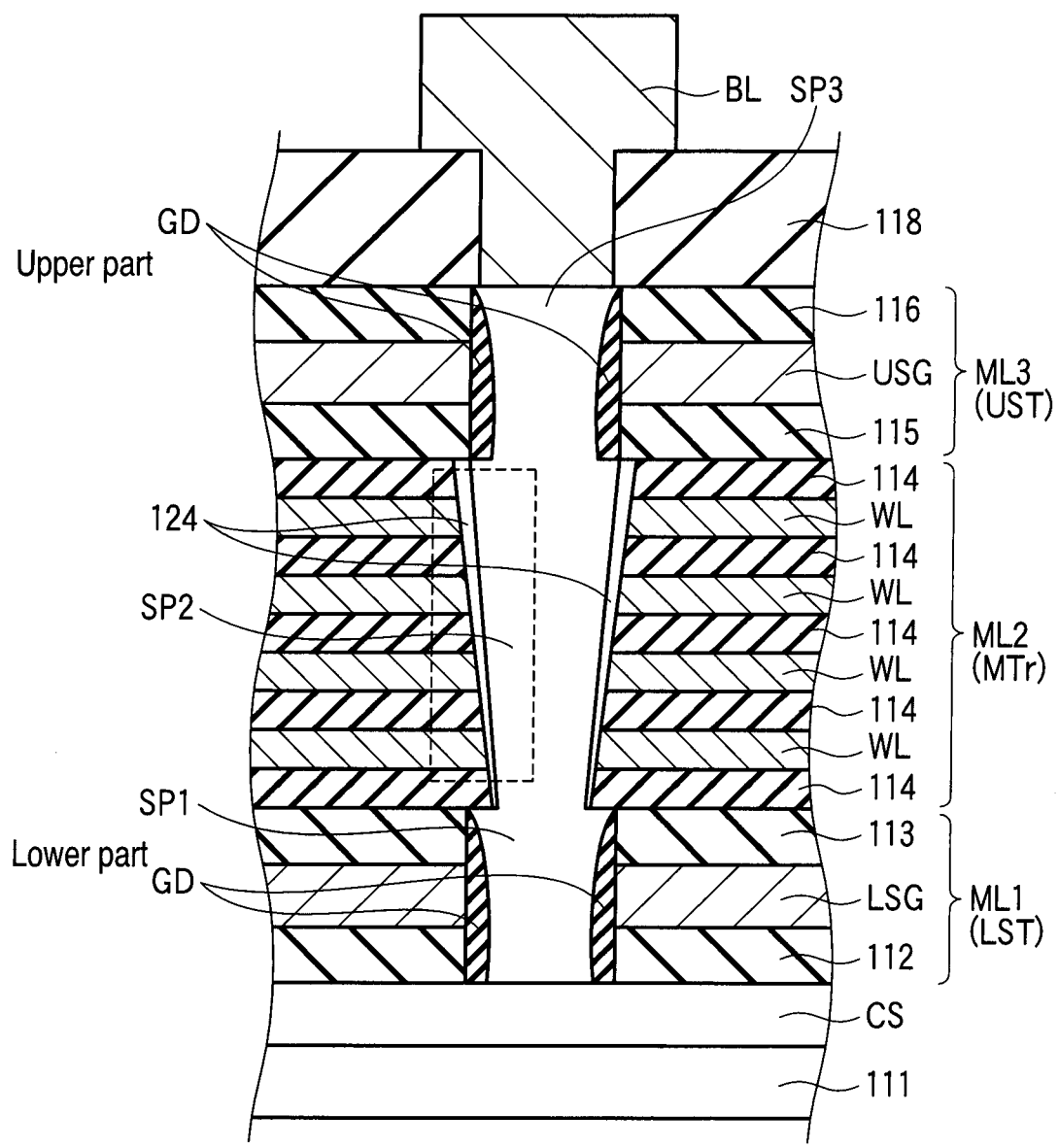
F I G. 2

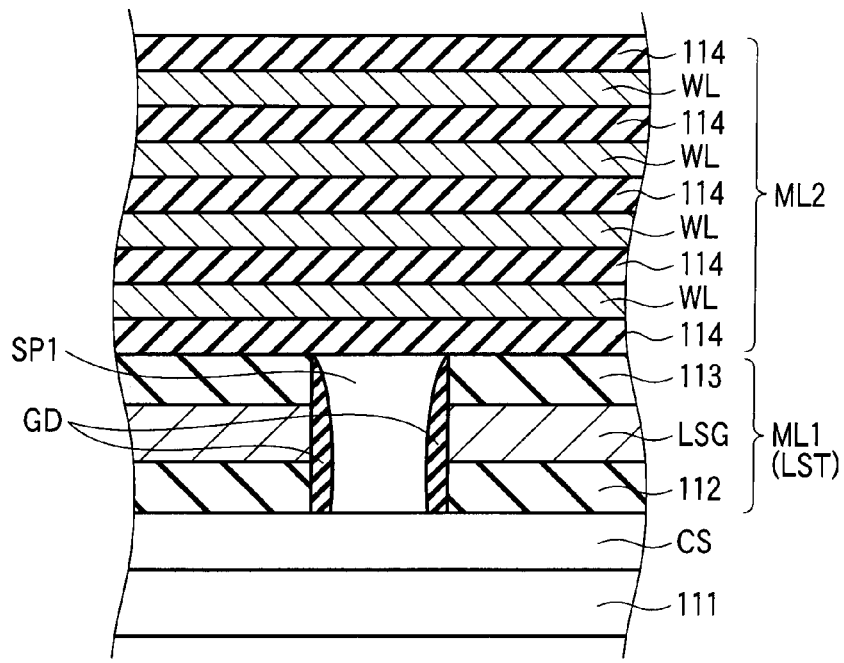
F I G. 6
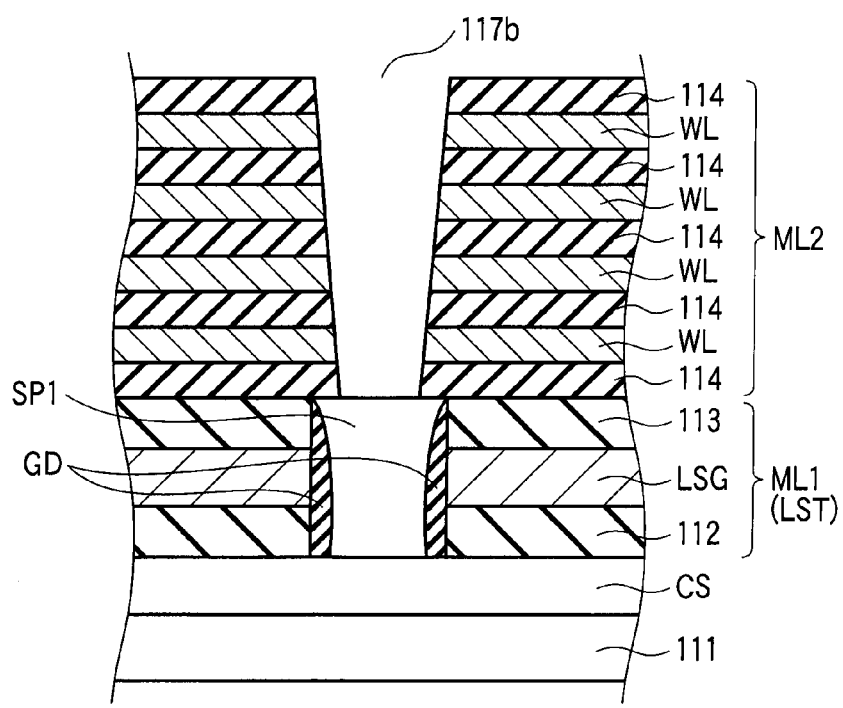
F I G. 7

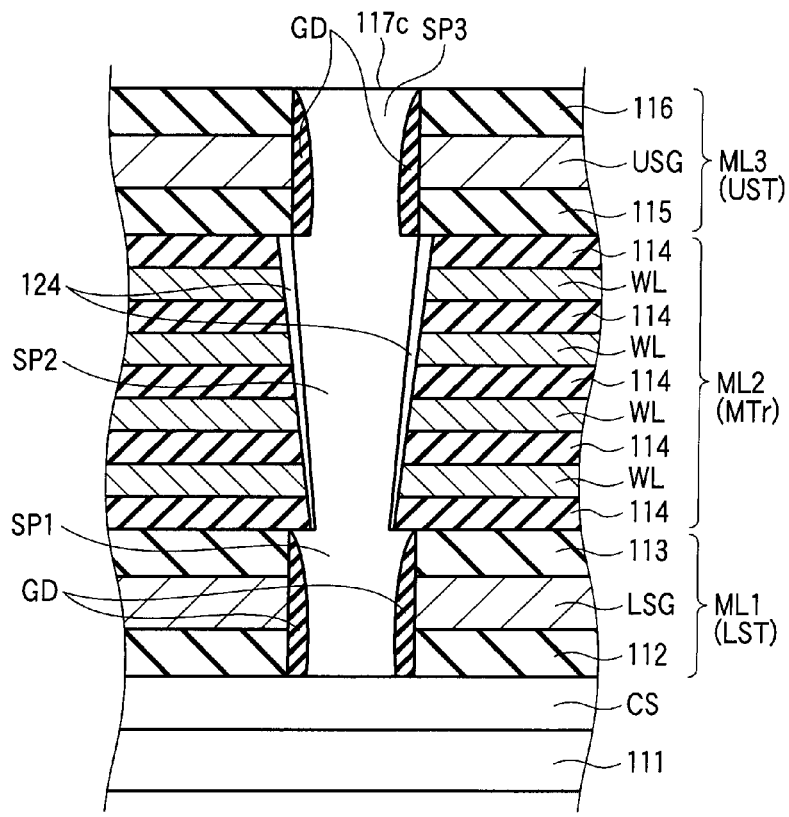
F I G. 10
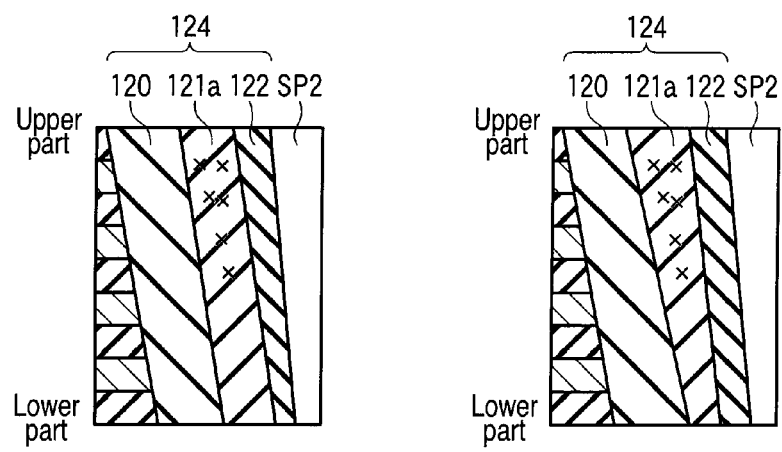
F I G. 11A  F I G. 11B

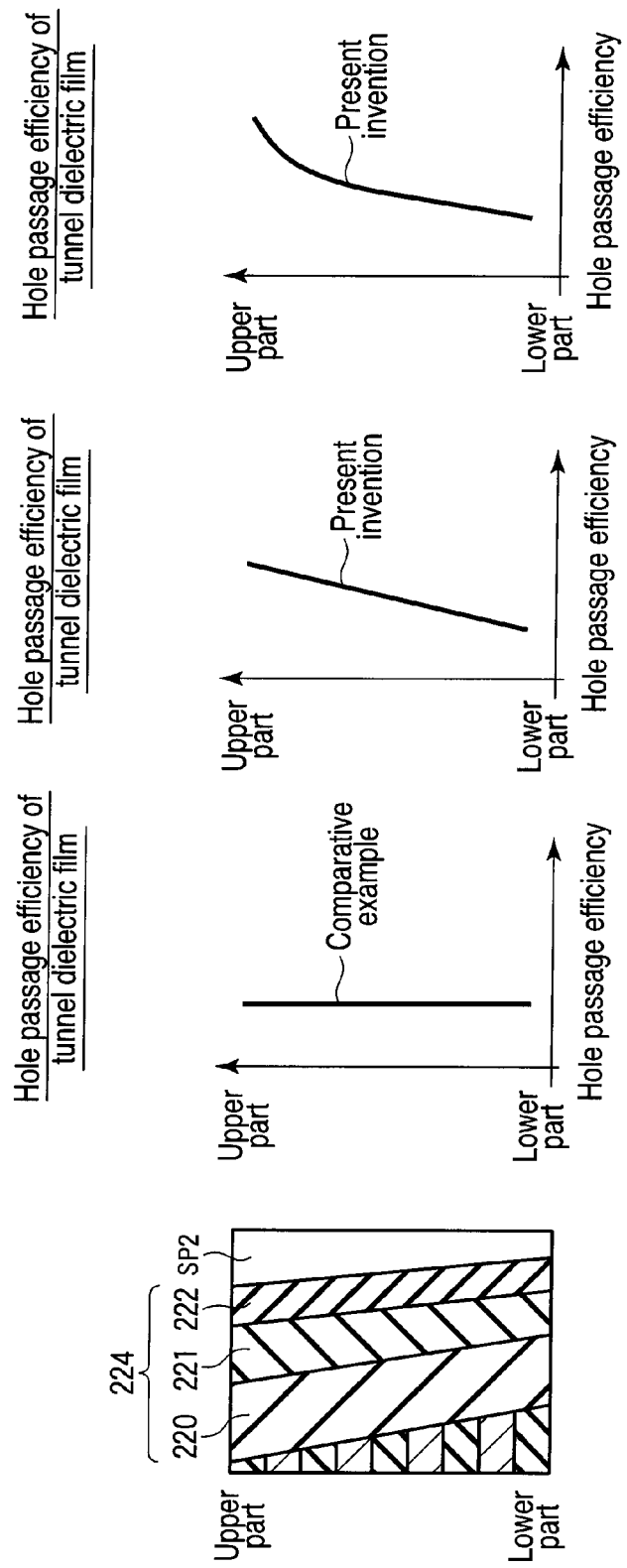
F I G. 15A  F I G. 15B  F I G. 15C  F I G. 15D

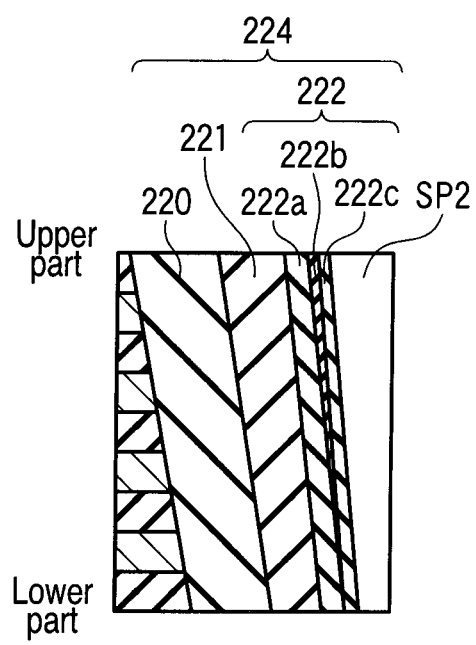
F I G. 16

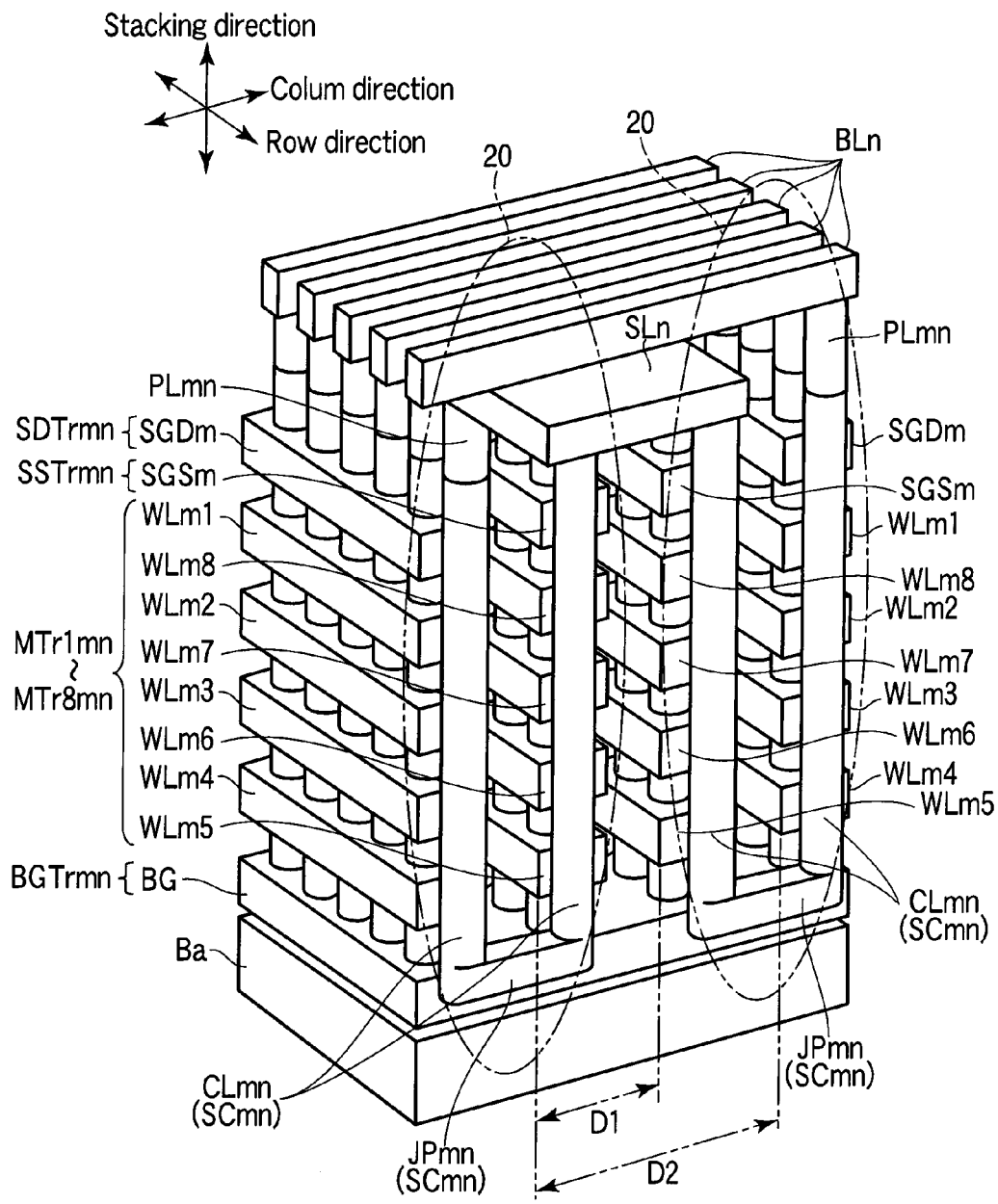
F I G. 17

SEMICONDUCTOR MEMORY DEVICE HAVING THREE-DIMENSIONALLY ARRANGED MEMORY CELLS, AND MANUFACTURING METHOD THEREOF

CROSS-REFERENCE TO RELATED APPLICATIONS

This application is based upon and claims the benefit of priority from prior Japanese Patent Application No. 2009-068963, filed Mar. 19, 2009, the entire contents of which are incorporated herein by reference.

BACKGROUND OF THE INVENTION

1. Field of the Invention

The present invention relates to a semiconductor memory device having memory cell transistors perpendicularly stacked on a substrate, and a manufacturing method thereof.

2. Description of the Related Art

In connection with NAND-type flash memories, there has been developed, for example, a three-dimensional stack memory wherein memory cells and select transistors constituting a memory string (NAND string) are stacked. There has also been developed a technique for collectively forming the memory cells and select transistors (e.g., see Jpn. Pat. Appln. KOKAI Publication No. 2007-266143). According to this technique, element isolation dielectric films and electrode films are alternately stacked on a semiconductor substrate, and then a memory hole is formed in the stacked films to provide a MONOS film and a control gate. However, it is difficult to form a perfectly perpendicular memory hole in this memory hole formation process. Therefore, the memory hole is tapered so that its diameter is smaller on a substrate interface side (lower side) and greater on an opposite bit line side (upper side). The difference in memory hole diameter between the substrate side and the bit line side is greater when the number of stacked layers is greater and the aspect ratio of the memory hole is higher. The variation of the hole diameter leads to a difference in electric field of the memory cells and to a variation in the thickness of the MONOS films of the memory cells. As a result, the write and erase characteristics of the memory cells are varied.

BRIEF SUMMARY OF THE INVENTION

According to a first aspect of the invention, there is provided a semiconductor memory device comprising: a semiconductor substrate; a first select transistor formed on the semiconductor substrate; memory cell transistors stacked on the first select transistor and connected in series; and a second select transistor formed on the memory cell transistors, wherein the memory cell transistors include a tapered semiconductor pillar which increases in diameter from the first select transistor toward the second select transistor, a tunnel dielectric film formed on the side surface of the semiconductor pillar, a charge storage layer which is formed on the side surface of the tunnel dielectric film and which increases in charge trap density from the first select transistor side toward the second select transistor side, a block dielectric film formed on the side surface of the charge storage layer, and conductor films which are formed on the side surface of the block dielectric film and which serve as gate electrodes.

According to a second aspect of the invention, there is provided a method of forming a semiconductor memory device, the method comprising: forming a first select transistor on a semiconductor substrate; stacking serially connected memory cell transistors on the first select transistor; and forming a second select transistor on the memory cell transistors, wherein forming the memory cell transistors comprises: forming dielectric layers and electrode layers alternately on the first select transistor; forming a tapered memory hole in the dielectric layers and the electrode layers, the memory hole increasing in diameter from the first select transistor toward the second select transistor; forming a block dielectric film on the dielectric layers and the electrode layers in the memory hole; forming a charge storage layer on the block dielectric film, the charge storage layer increasing in charge trap density from the first select transistor side toward the second select transistor side; forming a tunnel dielectric film on the charge storage layer; and embedding a semiconductor pillar in the memory hole.

According to a third aspect of the invention, there is provided a semiconductor memory device comprising: a semiconductor substrate; a first select transistor formed on the semiconductor substrate; memory cell transistors which are stacked on the first select transistor on the surface of the semiconductor substrate and which are connected in series; and a second select transistor formed on the memory cell transistors, wherein the memory cell transistors include a tapered semiconductor pillar which increases in diameter from the first select transistor toward the second select transistor, a tunnel dielectric film which is formed on the side surface of the semiconductor pillar and which increases in hole passage efficiency from the first select transistor toward the second select transistor, a charge storage layer formed on the side surface of the tunnel dielectric film, a block dielectric film formed on the side surface of the charge storage layer, and conductor films which are formed on the side surface of the block dielectric film and which serve as gate electrodes.

BRIEF DESCRIPTION OF THE SEVERAL VIEWS OF THE DRAWING

FIG. 2 is a sectional view showing a semiconductor memory device according to a first embodiment of the present invention;

FIGS. 4 to 10 are sectional views showing a method of manufacturing the semiconductor memory device according to the first embodiment of the present invention;

FIG. 11A is a sectional view showing Configuration 1 of the semiconductor memory device according to the first embodiment of the present invention;

FIG. 11B is a sectional view showing a modification of Configuration 1 of the semiconductor memory device according to the first embodiment of the present invention;

FIG. 15A is a sectional view showing the semiconductor memory device according to the second embodiment of the present invention, and FIGS. 15B, 15C and 15D are graphs showing the hole passage efficiency;

FIG. 16 is a sectional view showing the semiconductor memory device according to the second embodiment of the present invention;

FIG. 17 is a configuration diagram of a semiconductor memory device to which the present invention is applied.

DETAILED DESCRIPTION OF THE INVENTION

As described above, in a NAND string of a conventional collectively processed three-dimensional stack memory, a memory hole is tapered so that its diameter is smaller on a substrate interface side and greater on an opposite bit line side. If memory cells (e.g., MONOS cells) of uniform film thickness and quality are formed in this memory hole, a difference in electric field in the NAND string occurs because of the difference in hole diameter of the MONOS cells. Therefore, when writing and erasing are performed respectively at the same voltage in all of the MONOS cells, tunnel electric fields are stronger and thus write and erase speeds are higher in the substrate-side (lower-side) MONOS cells. In contrast, in the bit-line-side (upper-side) MONOS cells, tunnel electric fields are weaker and thus write and erase speeds are lower.

Furthermore, if the aspect ratio of the memory hole diameter is higher, the thickness of the formed MONOS layers is smaller on the lower side and greater on the upper side because of a loading effect. As a result, in the lower-side MONOS cells, tunnel electric fields are stronger, and thus write and erase speeds are higher. In the substrate-side MONOS cells, tunnel electric fields are weaker, and thus write and erase speeds are lower.

That is, it has been proved that there is a great variation of the write and erase speeds between the upper and lower sides of the NAND string for the above-mentioned two reasons and cell characteristics are thus varied, which hampers high-speed operation of a device.

Hence, the present invention improves the variation of the write and erase speeds in the NAND string and enables high-speed operation of the device.

Hereinafter, embodiments of the present invention will be described with reference to the drawings. It is to be noted that like signs are given to like parts throughout the drawings.

[1] Collectively Processed Three-Dimensional Stack Memory

Figure 1:
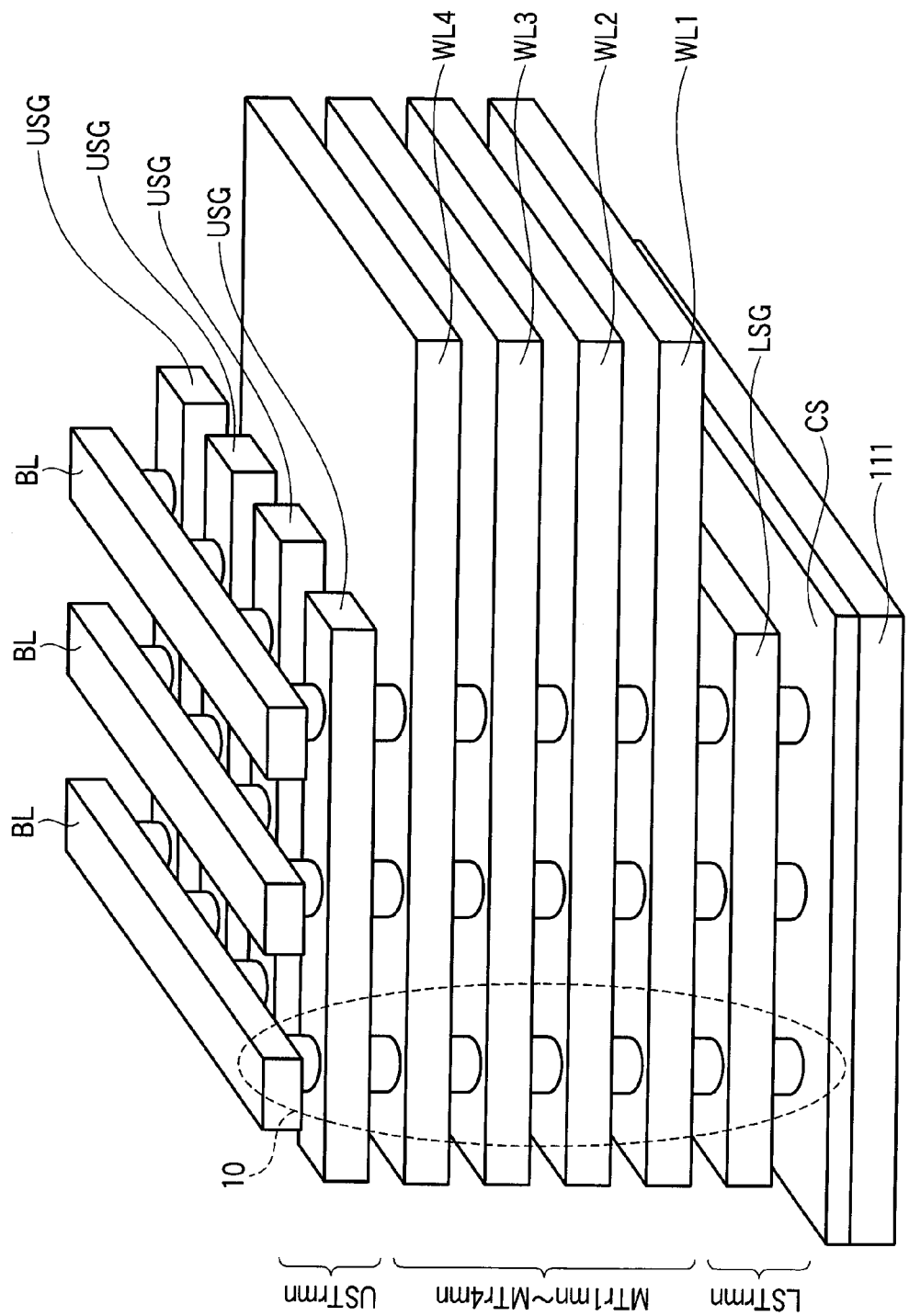
FIG. 1 is a configuration diagram showing a semiconductor memory device according to embodiments of the present invention.

First described referring to FIG. 1 is a collectively processed three-dimensional stack memory having a NAND string to which the present invention is applied.

As shown in FIG. 1, the collectively processed three-dimensional stack memory includes m×n (m and n are natural numbers) NAND strings 10. Each of the NAND strings 10 has a lower select transistor LSTrmn, memory cell transistors MTr1*mn* to MTr4*nm*, and an upper select transistor USTrmn. In the example shown in FIG. 1, m=3 and n=4.

In each of the NAND strings 10, gate electrodes of the memory cell transistors MTr1*mn* to MTr4*nm* are respectively connected to common word lines WL1 to WL4 which are formed by the same conductive layer. That is, in each of the NAND strings 10, all of the gate electrodes of the memory cell transistor MTr1*mn* are connected to the word line WL1, and all of the gate electrodes of the memory cell transistor MTr2*nm* are connected to the word line WL2. Further, in each of the NAND strings 10, all of the gate electrodes of the memory cell transistor MTr3*nm* are connected to the word line WL3, and all of the gate electrodes of the memory cell transistor MTr4*nm* are connected to the word line WL4.

Each of the word lines WL1 to WL4 has a two-dimensionally expanding plate-shaped planar structure. Moreover, the planar structure of each of the word lines WL1 to WL4 is perpendicular to each of the NAND strings 10. In addition, a lower select gate LSG for driving the lower select transistor LSTrmn can have a common potential for the respective layers in operation. Thus, the lower select gate LSG has a plate-shaped planar structure.

Each of the NAND strings 10 has a semiconductor pillar which is formed on an n+ region created in a P-well region (not shown) of a semiconductor substrate 111. The NAND strings 10 are arranged in matrix form in a plane perpendicular to the semiconductor pillar.

This semiconductor pillar may be in the shape of either a column or a prism. Moreover, the semiconductor pillar includes a stepped semiconductor pillar.

[2] First Embodiment

In a first embodiment, the trap density of a charge storage layer is varied between the upper side and lower side in the MONOS structure of a memory cell transistor MTr in a NAND string 10, thereby improving memory cell characteristics.

[2-1] Structure of NAND String

FIG. 2 shows the configuration of the NAND string 10 according to the first embodiment.

As shown in FIG. 2, the NAND string 10 comprises a semiconductor substrate (silicon substrate) 111, a low-resistance layer CS, a lower select transistor LST, the memory cell transistor MTr, an upper select transistor UST, an element isolation dielectric film 118 and a bit line BL.

The impurity-introduced low-resistance layer CS (e.g., an n+ diffusion layer) serving as a source line is formed on the semiconductor substrate 111. A silicon pillar (semiconductor pillar) SP1 is formed on the low-resistance layer CS perpendicularly to the surface of the semiconductor substrate 111. A gate dielectric film GD including a silicon oxide film as the main component is formed on the side surface of silicon pillar SP1. On the side surface of the gate dielectric film GD, there is formed a multilayer ML1 in which an element isolation dielectric film 124 including a silicon oxide film as the main component, a lower select gate LSG made of polycrystalline silicon and an element isolation dielectric film 113 including a silicon oxide film as the main component are stacked. The multilayer ML1 has a plate-shaped planar structure. The silicon pillar SP1, the gate dielectric film GD and the multilayer ML1 constitute the lower select transistor LST.

A silicon pillar SP2 is formed on silicon pillar SP1 of the lower select transistor LST perpendicularly to the surface of the semiconductor substrate 111. A later-described memory film 124 is formed on the side surface of silicon pillar SP2. On the side surface of the memory film 124, there is formed a multilayer ML2 in which an element isolation dielectric film 114 including a silicon oxide film as the main component and a word line WL are alternately stacked. The multilayer ML2 has a plate-shaped planar structure. The silicon pillar SP2, the memory film 124 and the multilayer ML2 constitute the plurality of memory cell transistors MTr. In the case shown in FIG. 2, the NAND string 10 is formed by, for example, four memory cell transistors MTr.

A silicon pillar SP3 is formed on the silicon pillar SP2 of the memory cell transistor MTr. A gate dielectric film GD including a silicon oxide film as the main component is formed on the side surface of silicon pillar SP3. On the side surface of the gate dielectric film GD, there is formed a multilayer ML3 in which an element isolation dielectric film 115 including a silicon oxide film as the main component, an upper select gate USG made of polycrystalline silicon and an element isolation dielectric film 116 including a silicon oxide film as the main component are stacked. The multilayer ML3 has a plate-shaped planar structure. The silicon pillar SP3, the gate dielectric film GD and the multilayer ML3 constitute the upper select transistor UST.

The bit line BL is formed on the silicon pillar SP3 of the upper select transistor UST, and the element isolation dielectric film 118 is formed on the side surface of the bit line BL. Consequently, one NAND string is configured.

Here, silicon pillar SP2 constituting the memory cell transistor MTr is tapered. That is, the silicon diameter (memory hole diameter) of silicon pillar SP2 increases from the lower select transistor LST side (lower side) toward the upper select transistor UST side (upper side). Thus, as described above, in the lower-side MONOS structure, a tunnel electric field is greater, and the amount of a charge flowing into a charge storage layer 121 is greater. In contrast, in the upper-side MONOS structure, a tunnel electric field is smaller, and the amount of a charge flowing into the charge storage layer 121 is smaller. However, in the case of the present embodiment, the trap density of the charge storage layer 121 is set in the following manner to allow for uniform characteristics of the memory cell transistors.

Figure 3:
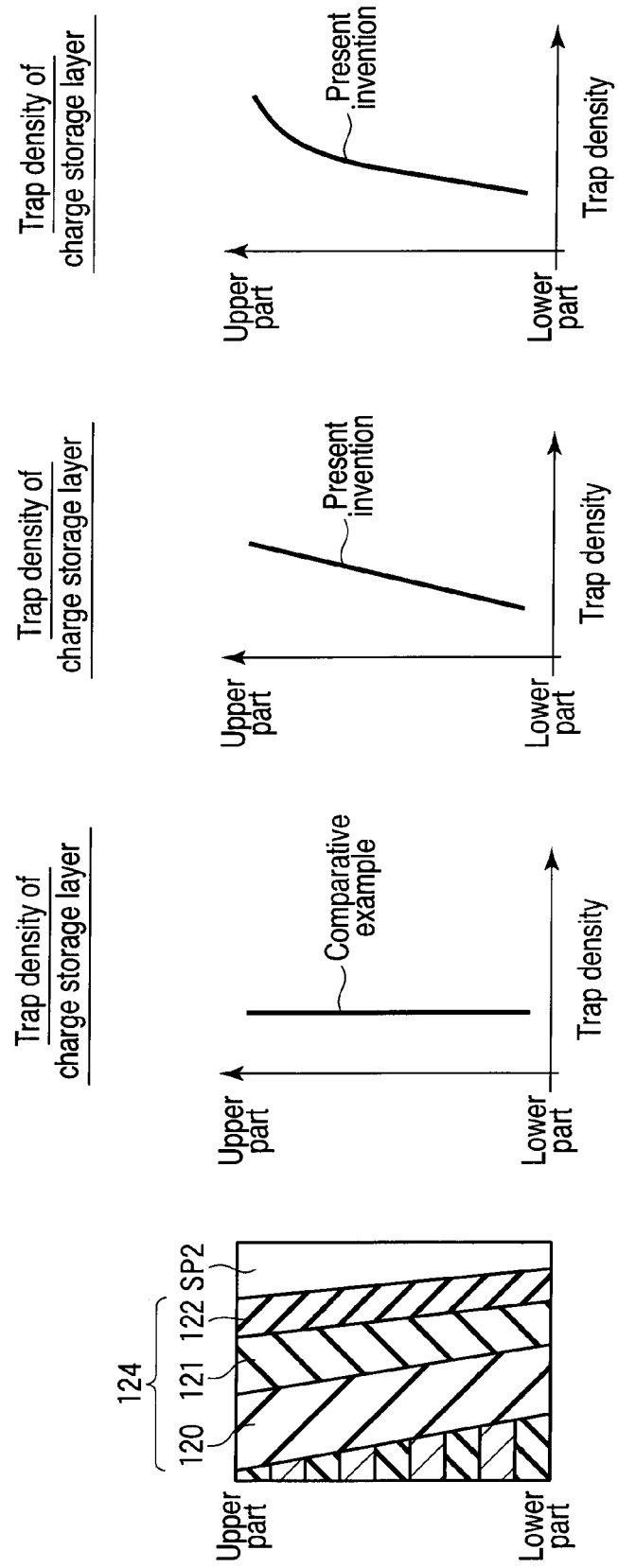
FIG. 3A is a sectional view showing the semiconductor memory device according to the first embodiment of the present invention.
FIGS. 3B, 3C and 3D are graphs showing trap density.

FIG. 3A shows the configuration of the memory film 124, and FIGS. 3B to 3D show the trap density of the charge storage layer 121 in the memory film 124.

As shown in FIG. 3A, the memory film 124 comprises a tunnel dielectric film 122, the charge storage layer 121 and a block dielectric film 120. The tunnel dielectric film 122 is formed on the side surface of the silicon pillar SP2. The tunnel dielectric film 122 is, for example, a silicon oxide film. The charge storage layer 121 is formed on the side surface of the tunnel dielectric film 122. The charge storage layer 121 consists of, for example, a silicon nitride film. The block dielectric film 120 is formed on the side surface of the charge storage layer 121. The block dielectric film 120 is, for example, an alumina or silicon nitride film.

Here, the charge trap density of the charge storage layer 121 is set to increase from the lower part toward the upper part as described later. The trap density of the charge storage layer 121 may gradually increase from the lower part toward the upper part or may rapidly increase in the upper part, but desirably changes suitably depending on the size of the memory hole diameter of silicon pillar SP2.

[2-2] NAND String Manufacturing Method

FIGS. 4 to 10 show a process of manufacturing the NAND string 10 according to the present embodiment.

Figure 4:
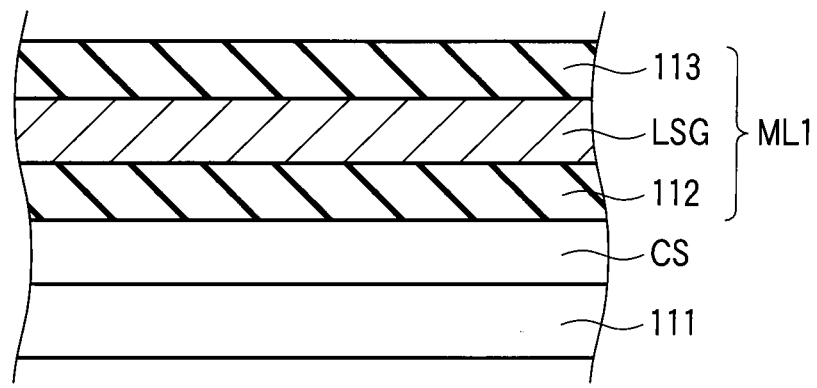

First, as shown in FIG. 4, impurity ions are implanted into a memory cell array region of the semiconductor substrate 111. As a result, a low-resistance n+ diffusion layer (cell source) CS is formed on the surface of the semiconductor substrate 111.

Then, an element isolation dielectric film 112 including a silicon oxide film as the main component is formed on the semiconductor substrate 111 on which the low-resistance layer CS is formed. This element isolation dielectric film 112 is formed by depositing a silicon oxide in accordance with an LPCVD method at a temperature of 650° C. to 750° C. using, for example, dichlorosilane and $N_2O$ as source gases.

Then, a lower select gate LSG made of a conductive film is formed on the element isolation dielectric film 112. This lower select gate LSG is formed by depositing n-type polycrystalline silicon in accordance with the LPCVD method at a temperature of 550° C. to 650° C. using, for example, $SiH_4$ and $PH_3$ as source gases.

Then, an element isolation dielectric film 113 including a silicon oxide film as the main component is formed on the lower select gate LSG. This element isolation dielectric film 113 is formed by depositing a silicon oxide in accordance with the LPCVD method at a temperature of 650° C. to 750° C. using, for example, dichlorosilane and $N_2O$ as source gases. Thus, a multilayer ML1 comprising the element isolation dielectric film 112, the lower select gate LSG and the element isolation dielectric film 113 is formed.

Figure 5:
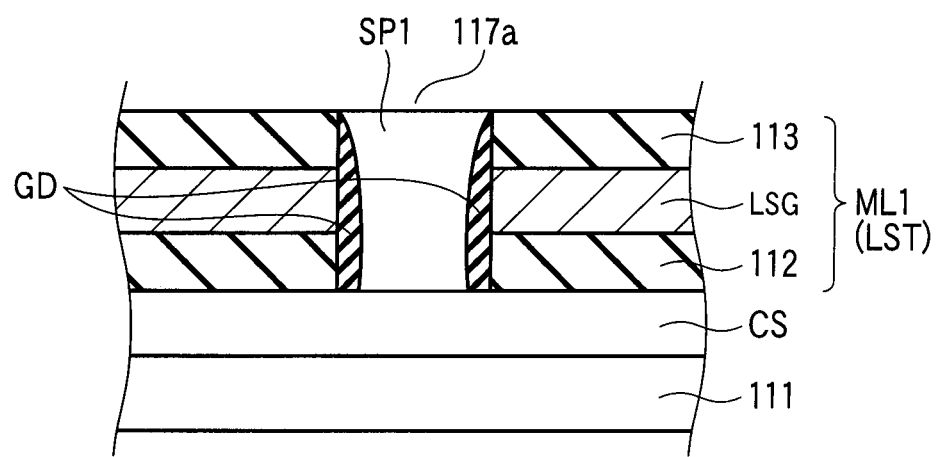

Then, as shown in FIG. 5, the multilayer ML1 is processed by lithography and etching. Thus, a memory hole 117a which exposes the low-resistance layer CS of the semiconductor substrate 111 is formed in the multilayer ML1.

Then, a silicon nitride film is formed on the entire surface of the multilayer ML1. This silicon nitride film is formed on the upper surface of the multilayer ML1 and on the bottom and side surfaces of the memory hole 117a. Further, the silicon nitride film on the upper surface of the multilayer ML1 and on the bottom surface of the memory hole 117a is removed by, for example, RIE. Thus, the silicon nitride film remains on the side surface of the memory hole 117a, and a gate dielectric film GD is formed.

Then, amorphous silicon is embedded in the memory hole 117a. As a result, a silicon pillar SP1 is formed in the memory hole 117a. Thus, a lower select transistor LST is formed.

Then, as shown in FIG. 6, for example, element isolation dielectric films 114 including silicon oxide films as the main component and word lines WL made of n-type polycrystalline silicon are alternately stacked, so that a multilayer ML2 is formed. In FIG. 6, the multilayer ML2 comprises five element isolation dielectric films 114 and four word lines WL that are alternately stacked.

Then, as shown in FIG. 7, the multilayer ML2 is coated with a photoresist (not shown). Further, the photoresist is patterned by exposure and development to form a photoresist film (not shown).

Then, the element isolation dielectric films 114 and the word lines WL that are stacked are collectively processed by the RIE using the photoresist film as a mask. Thus, a memory hole 117b which exposes the silicon pillar SP1 is formed in the multilayer ML2. That is, the memory hole 117b is formed in an area immediately above the memory hole 117a and communicates with the memory hole 117a. Moreover, as described above, the memory hole 117b is tapered so that its diameter increases from the lower part toward the upper part. Further, a wet treatment is carried out to remove processing residuals.

Figure 8:
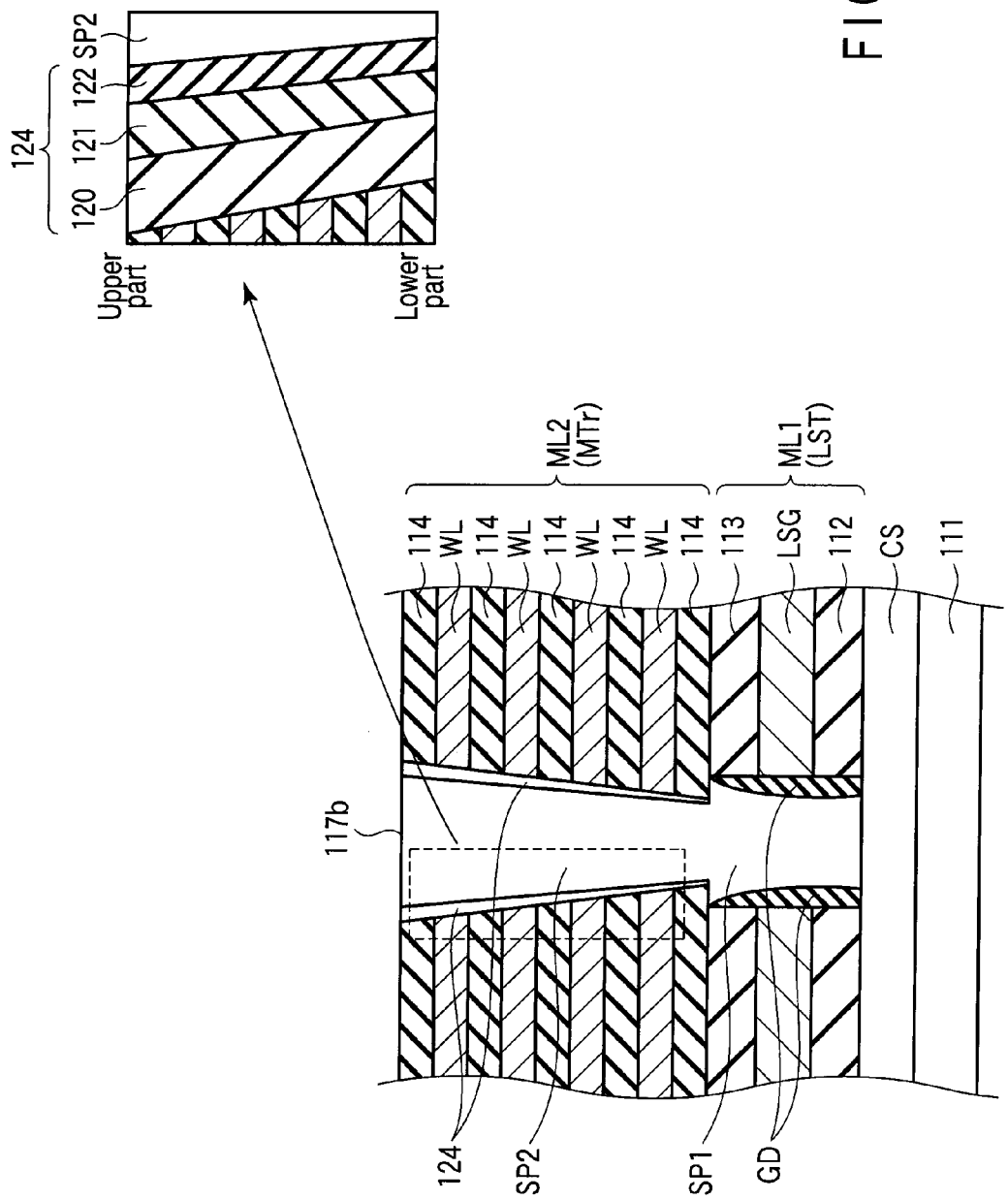

Then, as shown in FIG. 8, a block layer 120 is formed on the entire surface of the multilayer ML2. This block layer 120 is a film including, for example, an alumina or silicon nitride film as the main component. When the block layer 120 consists of alumina, the block layer 120 is formed by the atomic layer deposition (ALD) method using trimethylaluminum (TMA) and $H_2O$. When the block layer 120 is a silicon oxide film, the block layer 120 is formed by the ALD method using trisdimethylaminosilane (TDMAS) and $O_3$.

Then, a charge storage layer 121 including, for example, a silicon nitride film as the main component is formed on the block layer 120. This charge storage layer 121 is formed so that its trap density increases from the lower part toward the upper part. Details of a method of forming such a charge storage layer 121 will be described later.

Then, a tunnel dielectric film 122 including, for example, a silicon oxide film as the main component is formed on the charge storage layer 121. This tunnel dielectric film 122 is formed by the ALD method using trisdimethylaminosilane (TDMAS) and $O_3$. A memory film 124 consisting of the block layer 120, the charge storage layer 121 and the tunnel dielectric film 122 is formed on the upper surface of the multilayer ML2 and on the bottom and side surfaces of the memory hole 117b.

Then, silane is used as a source gas to remove, in accordance with the RIE, the memory film 124 on the upper surface of the multilayer ML2 and on the bottom surface of the memory hole 117b so that an amorphous silicon layer formed by the LPCVD method at a temperature of 500° C. to 600° C. serves as a protective film. Thus, the memory film 124 is only formed on the side surface of the memory hole 117b. Further, a wet treatment is carried out to remove processing residuals.

Then, amorphous silicon is embedded in memory hole 117b in accordance with the LPCVD method at a temperature of 500° C. to 600° C. using, for example, silane as a source gas. Further, amorphous silicon is crystallized into polycrystalline silicon by crystallization annealing, and a silicon pillar SP2 serving as a channel of a memory cell transistor MTr is formed. Thus, the memory cell transistor MTr is formed.

Figure 9:
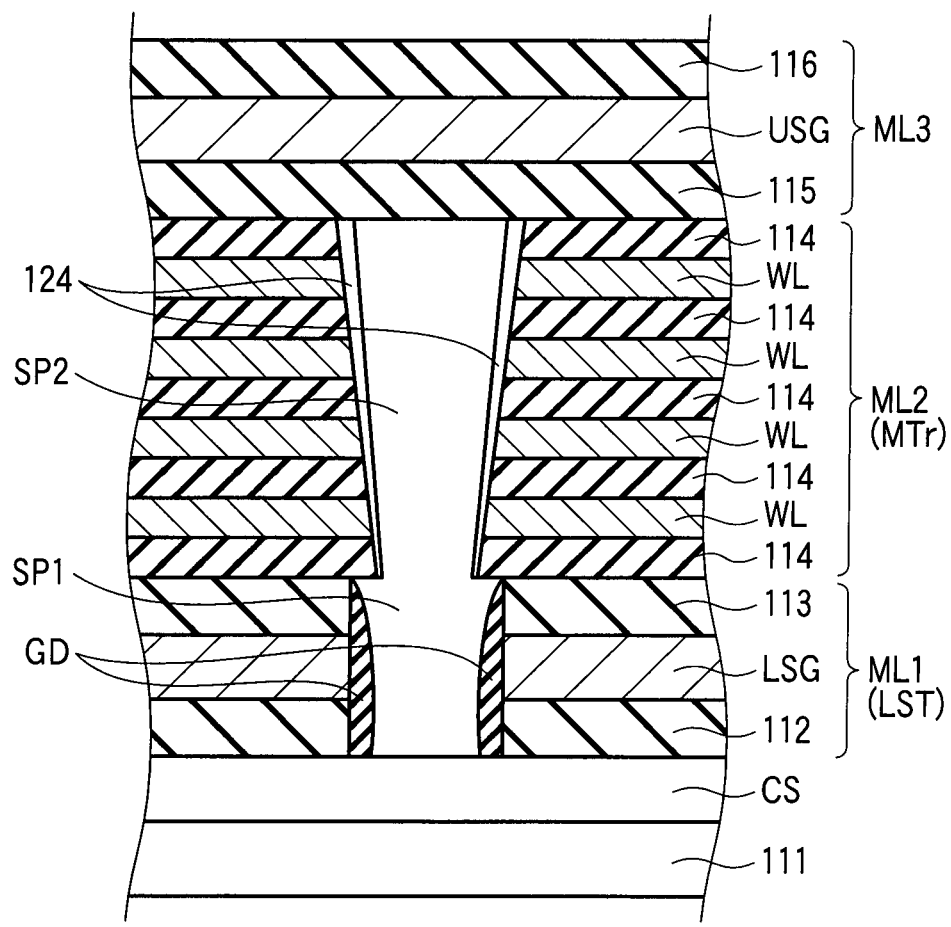

Then, as shown in FIG. 9, an element isolation dielectric film 115, an upper select gate USG and an element isolation dielectric film 116 are formed on the multilayer ML2 in order similarly to the multilayer ML1. Thus, a multilayer ML3 comprising the element isolation dielectric film 115, the upper select gate USG and the element isolation dielectric film 116 is formed.

Then, as shown in FIG. 10, a memory hole 117c which exposes silicon pillar SP2 is formed in the multilayer ML3. This memory hole 117c is formed in an area immediately above the memory hole 117b and communicates with the memory hole 117b. That is, the memory holes 117a to 117c respectively formed in the multilayers ML1 to ML3 communicate with one another.

Then, similarly to the lower select transistor LST, a gate dielectric film GD including silicon nitride is formed on the side surface of memory hole 117c in multilayer ML3, and a silicon pillar SP3 is formed in memory hole 117c. Thus, an upper select transistor UST is formed.

Then, as shown in FIG. 2, a dielectric film 118 is formed on the multilayer ML3. Further, a contact is formed in the dielectric film 118. Moreover, a metal film is formed all over the surface, and the metal film is patterned to form a bit line BL. This bit line BL is connected to silicon pillar SP3. Consequently, the NAND string according to the present embodiment is formed.

[2-3] Charge Storage Layer

Figure 12:
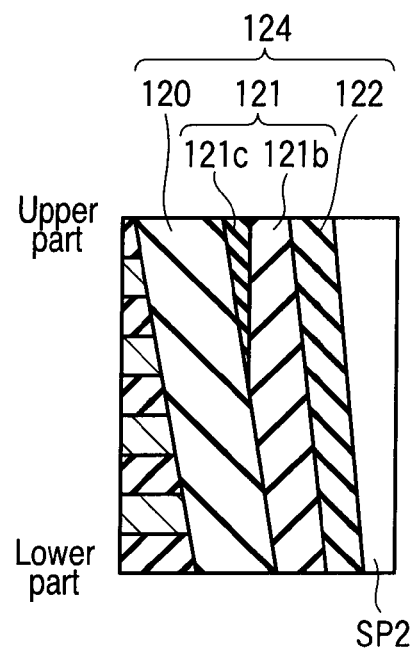
FIG. 12 is a sectional view showing Configuration 2 of the semiconductor memory device according to the first embodiment of the present invention.
Figure 13:
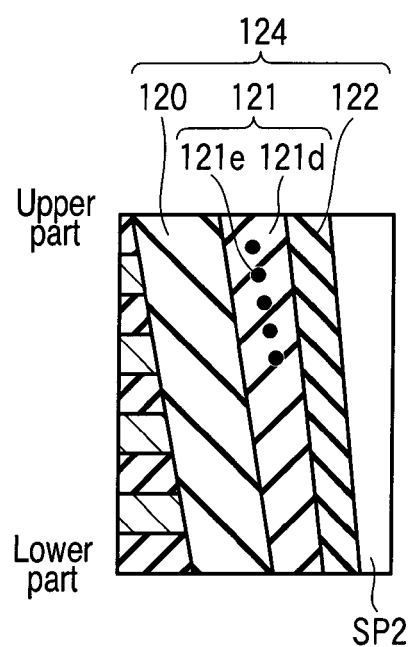
FIG. 13 is a sectional view showing Configuration 3 of the semiconductor memory device according to the first embodiment of the present invention.

The configuration of the above-mentioned charge storage layer 121 which increases in trap density from the lower part toward the upper part is described referring to FIGS. 11 to 13.

[2-3(a)] Configuration 1

FIG. 11A shows Configuration 1 of the memory film 124 in the memory cell transistor MTr according to the present embodiment.

As shown in FIG. 11A, the charge storage layer 121 of the memory film 124 in Configuration 1 is configured by a first silicon nitrogen-containing film (first silicon nitride film) 121a which has a uniform thickness from the lower side to the upper side and which increases in the composition ratio of silicon from the lower side toward the upper side. That is, the N/Si composition ratio of the first silicon nitride film 121a is, on the lower side, about 1.33 which is close to a stoichiometric composition ratio, and is, on the upper side, less than about 1.33 which makes the first silicon nitride film silicon-richer than the stoichiometric composition ratio. When the first silicon nitride film 121a is silicon-rich, the N/Si composition ratio of the first silicon nitride film 121a is desirably 1.2 or more.

The composition ratio of silicon thus increases from the lower side toward the upper side in the charge storage layer 121, so that the charge trap density on the upper side is higher and the charge trap density on the lower side is lower.

An example of a method of forming the charge storage layer 121 in Configuration 1 is described below.

First, a thin silicon nitride film (not shown) having a uniform composition is formed on the block dielectric film 120 by the ALD method which alternately supplies dichlorosilane and NH3 as source gases. The formation of this thin silicon nitride film is a process which provides a good coverage in the upper and lower parts of the NAND string and which does not easily produce a loading effect.

Then, the source gas is changed to silane, and the pressure is increased to a degree that does not cause any vapor phase reaction, thereby forming a silicon thin film (not shown) on the silicon nitride film. The formation of this silicon thin film is a process which provides a poor coverage in the upper and lower parts of the NAND string and which easily produces the loading effect. That is, the silicon thin film is easily formed on the upper part of the NAND string and is not easily formed on the lower part of the NAND string.

Then, a thermal treatment may be carried out so that the silicon concentration in the thickness direction of the charge storage layer 121 spreads uniformly. In this case, the charge storage layer 121 is much greater in its depth direction (longitudinal direction) than in its thickness direction, so that the composition ratio of silicon in the depth direction is not subject to the thermal treatment and is maintained.

The silicon nitride film formation process which does not easily produce the loading effect and the silicon thin film formation process which easily produces the loading effect are thus alternately carried out, thereby forming the charge storage layer 121 consisting of the first silicon nitride film 121a which is equal in thickness on the upper and lower sides and which is high in the composition ratio of silicon on the upper side of the NAND string and low in the composition ratio of silicon on the lower side of the NAND string.

FIG. 11B shows a modification of Configuration 1 of the memory film 124 in the memory cell transistor MTr according to the present embodiment.

As shown in FIG. 11B, the thickness of the first silicon nitride film 121a may be smaller on the lower side of the NAND string and greater on the upper side of the NAND string. Especially when the N/Si ratio of the first silicon nitride film 121a is 1.2 or less on the upper side, the thickness of the first silicon nitride film 121a should be greater on the upper side. This reason is described below.

In general, in a silicon nitride film close to the normal stoichiometric composition, a greater thickness leads to a smaller tunnel electric field and a lower tunnel current, and therefore leads to lower write and erase speeds. However, in a silicon-rich silicon nitride film, a greater thickness leads to a greater absolute amount of the trap, so that the write and erase speeds increase even if the tunnel electric field is smaller.

In a formation method according to this modification, a silicon nitride film is first formed by the ALD method which alternately supplies dichlorosilane and $NH_3$ as source gases and which does not easily produce the loading effect. Then, a silicon thin film is formed by a PECVD or sputtering method which easily produces the loading effect. Then, a silicon nitride film is formed again by the ALD method which does not easily produce the loading effect. Further, a thermal treatment may be carried out to obtain a uniform silicon concentration in the thickness direction of the charge storage layer 121. Such a method makes it possible to vary the composition of the silicon nitride film between the upper and lower parts of the NAND string 10 but also vary the thickness.

[2-3(b)] Configuration 2

FIG. 12 shows Configuration 2 of the memory film 124 in the memory cell transistor MTr according to the present embodiment.

As shown in FIG. 12, the charge storage layer 121 of the memory film 124 in Configuration 2 is configured by a stacked film consisting of a second silicon nitrogen-containing film (second silicon nitride film) 121b formed on the side surface of the tunnel dielectric film 122 and a high-dielectric-constant dielectric film 121c formed on the side surface of the second silicon nitride film 121b. This high-dielectric-constant dielectric film 121c increases in thickness from the lower side toward the upper side. In addition, the high-dielectric-constant dielectric film 121c may only be formed on the upper part of the second silicon nitride film 121b. Moreover, the relative dielectric constant of the high-dielectric-constant dielectric film 121c is desirably 10 or more.

The high-dielectric-constant dielectric film 121c which increases in thickness from the lower side toward the upper side is thus stacked in the charge storage layer 121, so that the charge trap density on the upper side is higher and the charge trap density on the lower side is lower.

An example of a method of forming the charge storage layer 121 in Configuration 2 is described below.

First, a high-dielectric-constant dielectric film (e.g., a hafnia film) 121c is formed on the block dielectric film by the PECVD or sputtering method which easily produces the loading effect. Then, a silicon nitride film (second silicon nitride film 121b) is formed by the ALD method which alternately supplies dichlorosilane and NH3 as source gases and which does not easily produce the loading effect. Thus, the charge storage layer 121 is formed which comprises the second silicon nitride film 121b and the high-dielectric-constant dielectric film 121c that increases in thickness from the lower side toward the upper side.

[2-3(c)] Configuration 3

FIG. 13 shows Configuration 3 of the memory film 124 in the memory cell transistor MTr according to the present embodiment.

As shown in FIG. 13, the charge storage layer 121 of the memory film 124 in Configuration 3 is configured by a third silicon nitrogen-containing film (third silicon nitride film) 121d including a nanocrystal 121e of metal or silicon. This nanocrystal 121e increases in existence density from the lower side toward the upper side. In addition, the nanocrystal 121e may only be formed on the upper part of the third silicon nitride film 121d.

Thus, the charge storage layer 121 contains the nanocrystal 121e which increases in existence density from the lower side toward the upper side, so that the charge trap density on the upper side is higher and the charge trap density on the lower side is lower.

An example of a method of forming the charge storage layer 121 in Configuration 3 is described below.

First, a silicon nitride film is formed by the ALD method which alternately supplies dichlorosilane and NH3 as source gases and which does not easily produce the loading effect. Then, a silicon thin film is formed by the PECVD or sputtering method which easily produces the loading effect. Then, a silicon nitride film is formed again by the ALD method which does not easily produce the loading effect. Further, a rapid thermal anneal (RTA) treatment at about 900° C. to 1000° C. is carried out. This RTA treatment is carried out at a high temperature in a short time, and productivity can therefore be improved. Thus, the charge storage layer 121 configured by the third silicon nitride film 121d containing the nanocrystal 121e of silicon is formed.

In addition, the third silicon nitride film 121d containing the nanocrystal of metal can be similarly formed by forming a metal thin film instead of the silicon thin film. Moreover, W, WN, Hf, Zr and Ti, for example, can be applied as metal materials.

[2-4] Effects

According to the first embodiment described above, as shown in FIGS. 3C and 3D, the charge trap density is higher on the upper side and the charge trap density is lower on the lower side in the charge storage layer 121 of the memory film 124 that constitutes the NAND string 10 of the collectively processed three-dimensional stack memory having an upper side where the tunnel electric field is small and a lower side where the tunnel electric field is great. That is, in the present embodiment, the trap density of the charge storage layer 121 is higher on the upper side where the tunnel electric field is small and the write and erase speeds are low, while the trap density of the charge storage layer 121 is lower on the lower side where the tunnel electric field is great and the write and erase speeds are high. Consequently, variation of the write and erase speeds between the upper and lower sides of the NAND string 10 due to the tapered shape of the memory hole can be reduced as compared with case of the trap density in a comparative example shown in FIG. 3B, thereby enabling high-speed operation of the device.

Moreover, Configurations 1 to 3 can be combined together. This makes it possible to further reduce the variation of the write and erase speeds between the upper and lower sides of the NAND string 10.

[3] Second Embodiment

In the first embodiment, the trap density of the charge storage layer is varied between the upper and lower sides in the MONOS structure of the memory cell transistor. On the contrary, in the second embodiment, the hole passage efficiency of the tunnel dielectric film is varied between the upper and lower sides in the MONOS structure to improve memory cell characteristics. It is to be noted that similarities between the second embodiment and the first embodiment are not described and differences are described in detail.

[3-1] Structure of NAND string

Figure 14:
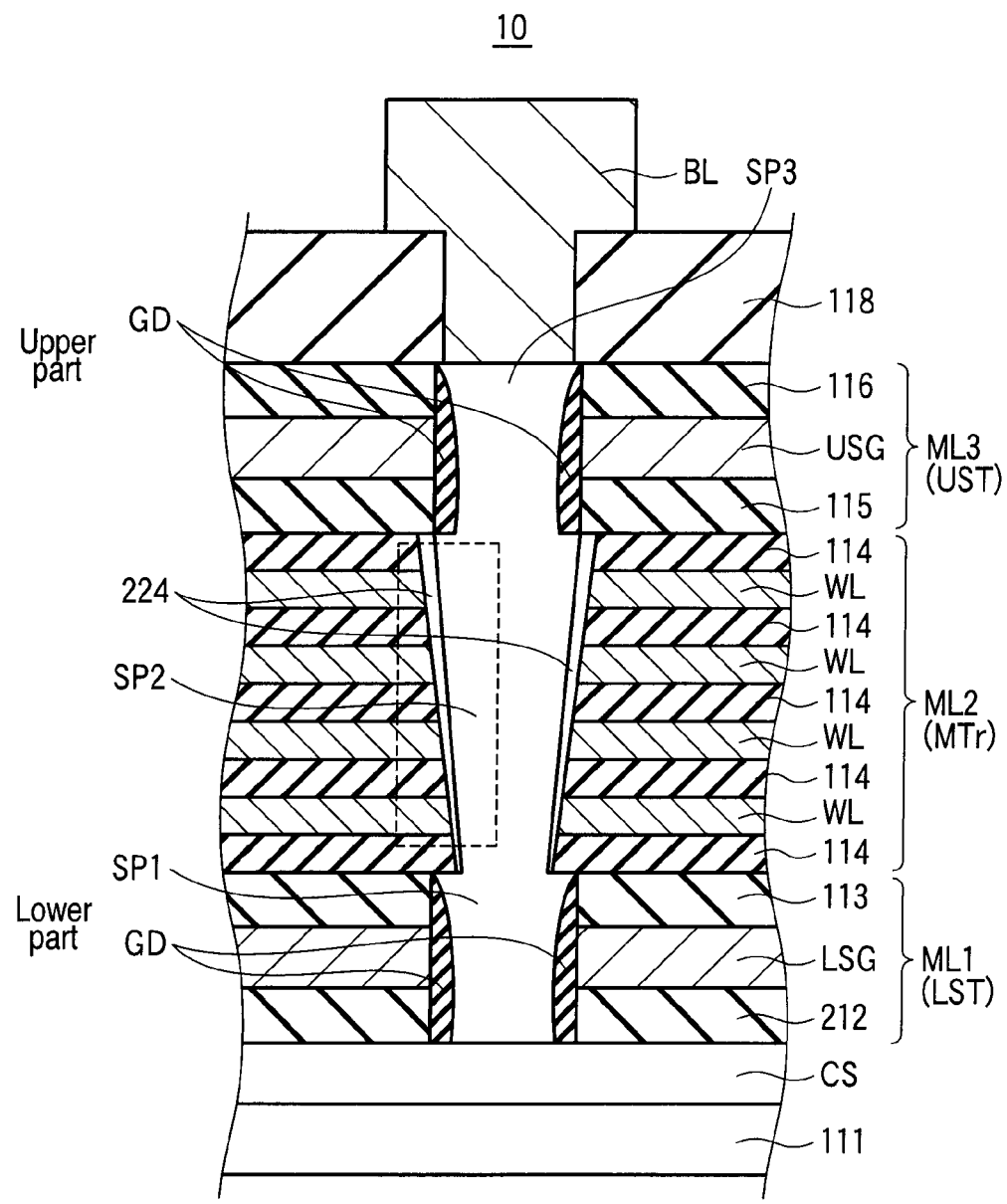
FIG. 14 is a sectional view showing a semiconductor memory device according to a second embodiment of the present invention.

FIG. 14 shows the configuration of a NAND string 10 according to the second embodiment.

As shown in FIG. 14, the difference between the NAND string 10 in the present embodiment and the NAND string 10 in the first embodiment is in the configuration of a memory film 224.

FIG. 15A shows the configuration of the memory film 224 of a memory cell transistor MTr according to the present embodiment, and FIGS. 15B to 15D show the hole passage efficiency of the tunnel dielectric film in the memory film 224. As shown in FIG. 15A, the memory film 224 comprises a tunnel dielectric film 222, a charge storage layer 221 and a block dielectric film 220. The difference between the present embodiment and the first embodiment is that the hole passage efficiency of the tunnel dielectric film 222 increases from the lower part toward the upper part as shown in FIGS. 15C and 15D. The hole passage efficiency of the tunnel dielectric film 222 may gradually increase from the lower part toward the upper part or may rapidly increase in the upper part, but desirably changes suitably depending on the size of the memory hole diameter of a silicon pillar SP2.

[3-2] NAND String Manufacturing Method

In a method of manufacturing the NAND string 10 according to the present embodiment, as in the first embodiment, the low-resistance layer CS is formed on the surface of a semiconductor substrate, and on this low-resistance layer CS, a lower select transistor LST, a memory cell transistor MTr, an upper select transistor UST, an element isolation dielectric film 118 and a bit line BL are formed in order.

The difference between the present embodiment and the first embodiment is in the method of producing the memory film 224. After a memory hole is formed in a multilayer ML2, a block dielectric film 220 is formed on the entire surface of the multilayer ML2. Then, a charge storage layer 221 consisting of, for example, a silicon nitride film is formed on the block dielectric film 220. Then, a tunnel dielectric film 222 which increases in hole passage efficiency from the lower part toward the upper part is formed on the charge storage layer 221. The method of forming such a tunnel dielectric film 222 will be described later. The memory film 224 on the upper surface of multilayer ML2 and on the bottom surface of the memory hole is removed by the RIE. Thus, the memory film 224 is only formed on the side surface of the memory hole.

[3-3] Tunnel Dielectric Film

The configuration of the above-mentioned tunnel dielectric film 222 which increases in hole passage efficiency from the lower part toward the upper part is described referring to FIG. 16.

FIG. 16 shows the memory film 224 in the memory cell transistor MTr according to the present embodiment.

As shown in FIG. 16, the tunnel dielectric film 222 of the memory film 224 according to the present embodiment is configured by a stacked layer consisting of a first dielectric film (first silicon oxide film) 222a including a silicon oxide film as the main component, a second dielectric film (fourth silicon nitride film) 222b including a silicon nitride film as the main component, and a third dielectric film (second silicon oxide film) 222c including a silicon oxide film as the main component. This fourth silicon nitride film 222b increases in thickness from the lower side toward the upper side.

In addition, the first silicon oxide film 222a and the second silicon oxide film 222c may be constant in thickness throughout the NAND string or may be smaller in thickness on the lower side and greater in thickness on the upper side. Here, the thickness difference between the upper side and lower side of the fourth silicon nitride film 222b is desirably greater than the thickness difference between the upper sides and lower sides of the first silicon oxide film 222a and the second silicon oxide film 222c. Moreover, the composition ratio of the fourth silicon nitride film 222b may be uniform on the upper side and lower side, but it is desirable that the composition ratio of the fourth silicon nitride film 222b is the stoichiometric composition on the lower side and is silicon-rich on the upper side. The fourth silicon nitride film 222b which increases in thickness from the lower side toward the upper side is thus stacked in the tunnel dielectric film 222, so that the hole passage efficiency on the upper side is higher and the hole passage efficiency on the lower side is lower.

An example of a method of forming the tunnel dielectric film 222 is described below.

First, the first silicon oxide film 222a is formed on the charge storage layer 221 by the ALD method using TDMAS and $O_3$ as source gases. Then, the fourth silicon nitride film 222b is formed on the first silicon oxide film 222a by the ALD method which uses dichlorosilane and an ammonia radical and which easily produces the loading effect. This fourth silicon nitride film 222b is formed to increase in thickness from the lower side toward the upper side. Then, the second silicon oxide film 222c is formed on the fourth silicon nitride film 222b in the same manner as the first silicon oxide film 222a. Thus, the tunnel dielectric film 222 consisting of the first silicon oxide film 222a, the fourth silicon nitride film 222b and the second silicon oxide film 222c is formed.

In addition, a fourth dielectric film (silicon oxynitride film) which increases in thickness from the lower side toward the upper side may be formed instead of the fourth silicon nitride film 222b. This silicon oxynitride film is formed by the exposure of the first silicon oxide film 222a to plasma containing nitrogen after the formation of the first silicon oxide film 222a.

Moreover, a stacked layer consisting of the silicon oxynitride film and the fourth silicon nitride film 222b which increases in thickness from the lower side toward the upper side may be formed instead of the fourth silicon nitride film 222b. The silicon oxynitride film and the fourth silicon nitride film 222b are stacked and thereby produce the stacked layer. The silicon oxynitride film is formed by the exposure of the first silicon oxide film 222a to plasma containing nitrogen after the formation of the first silicon oxide film 222a. Then, the fourth silicon nitride film 222b is formed by the ALD method which uses dichlorosilane and an ammonia radical.

[3-4] Effects

According to the second embodiment described above, the hole passage efficiency is higher on the upper side and lower on the lower side in the tunnel dielectric film 222 of the memory film 224 that constitutes the NAND string 10 of the collectively processed three-dimensional stack memory having an upper side where the tunnel electric field is small and a lower side where the tunnel electric field is great. That is, in the present embodiment, the hole passage efficiency of the tunnel dielectric film 222 is higher on the upper side where the tunnel electric field is small and the write and erase speeds are low, while the hole passage efficiency of the tunnel dielectric film 222 is lower on the lower side where the tunnel electric field is great and the write and erase speeds are high. Consequently, variation of the write speed and especially the erase speed between the upper and lower sides of the NAND string 10 can be smaller than in the case of the hole passage efficiency in a comparative example shown in FIG. 15B, thereby enabling high-speed operation of the device.

In addition, the second embodiment can be combined with the first embodiment. This makes it possible to further reduce the variation of the write and erase speeds between the upper and lower sides of the NAND string 10.

[4] Application of the Present Invention

The collectively processed three-dimensional stack memory having the NAND string to which the present invention is applied has been described with FIG. 1. However, the present invention is not limited thereto and is also applicable to the following collectively processed three-dimensional stack memory.

Figure 18:
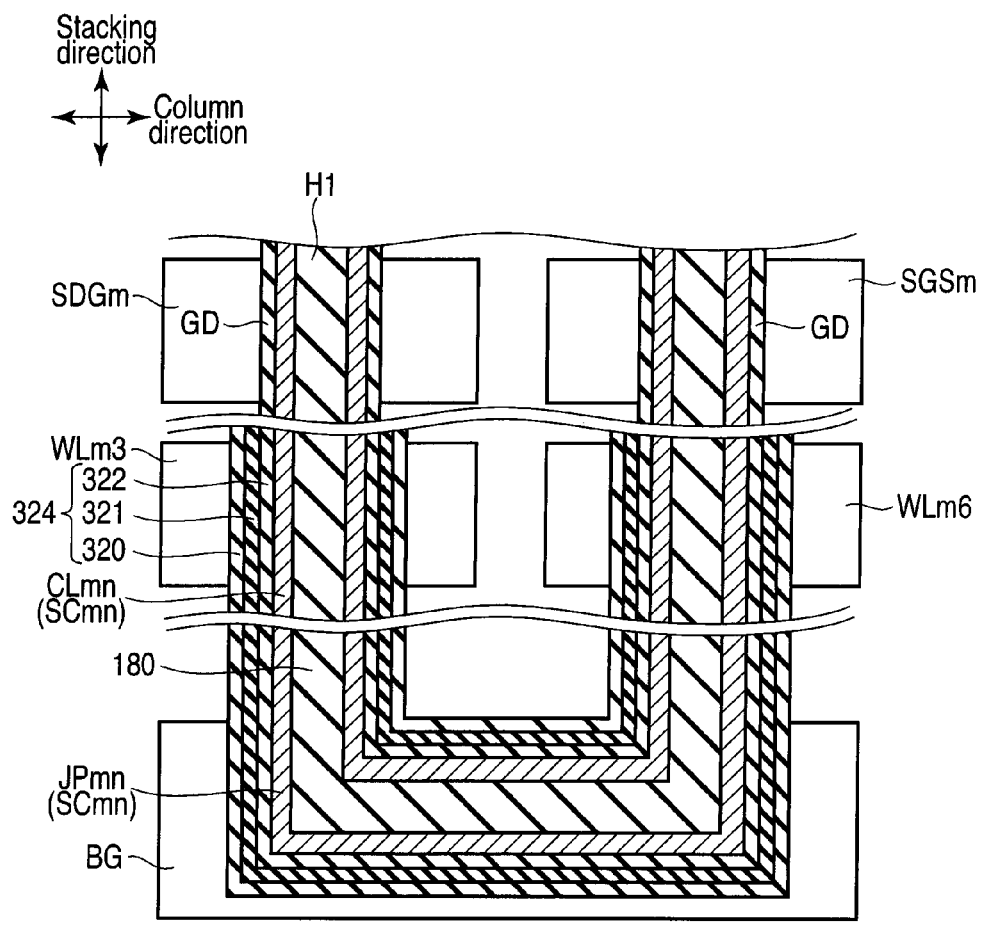
FIG. 18 is a partially enlarged sectional view of FIG. 17.

FIG. 17 is a configuration diagram of the collectively processed three-dimensional stack memory to which the present invention is applied. FIG. 18 is a partially enlarged sectional view of FIG. 17.

As shown in FIG. 17, the collectively processed three-dimensional stack memory includes m×n (m and n are natural numbers) memory strings 20. Each of the memory strings 20 has memory cell transistors MTr1$mn$ to MTr8$nm$, a source-side select transistor SSTrmn and a drain-side select transistor SDTrmn. In the example shown in FIG. 17, m=6 and n=2.

Each of the memory strings 20 has a U-shaped semiconductor SCmn, a word line WLmn (WLm1 to WLm8), a source-side select gate line SGSm and a drain-side select gate line SGDm. Moreover, the memory string 20 has a back gate line BG.

The U-shaped semiconductor SCmn is U-shaped when viewed from a row direction. The U-shaped semiconductor SCmn has a pair of pillar portions CLmn extending perpendicularly to a semiconductor substrate Ba, and a junction JPmn formed to join the lower ends of the pair of pillar portions CLmn. Moreover, as shown in FIG. 18, the U-shaped semiconductor SCmn has a hollow H1 which extends from the upper end of one pillar portion CLmn through the upper end of the other pillar portion CLmn via the junction JPmn. A dielectric portion 180 is formed in the hollow H1. The pillar portion CLmn may be in the shape of either a column or a prism. Alternatively, the pillar portion CLmn may be in the shape of a stepped pillar. Here, the row direction is a direction perpendicular to a stacking direction, and a column direction described later is a direction perpendicular to a vertical direction and the row direction.

The U-shaped semiconductor SCmn is disposed so that a straight line connecting the central axes of the pair of pillar portions CLmn may be parallel to the column direction. Moreover, the U-shaped semiconductor SCmn is disposed to be in matrix form in a plane composed of the row direction and the column direction.

The word line WLmn of each layer extends parallel to the row direction. The word lines WLmn of the respective layers are formed in a line-and-space manner so that these word lines are isolated from one another at first intervals in the column direction.

The gates of the memory cell transistors (MTr1$mn$ to MTr8$nm$) provided at the same position in the column direction and arranged in the row direction are connected to the same word line WLmn. Each word line WLmn is disposed perpendicularly to the memory string 20. Although not shown, the ends of the word lines WLmn in the row direction and the column direction are stepped. It should be noted that the ends of the word lines WLmn in the column direction are not exclusively stepped. For example, the ends of the word line WLmn in the column direction may be formed to be aligned at a predetermined position in the column direction.

As shown in FIG. 18, memory film 324 an oxide-nitride-oxide (ONO) memory film 324 is formed between the word line WLmn and the pillar portion CLmn. The memory film 324 has a tunnel dielectric film 322 in contact with the pillar portion CLmn, a charge storage layer 321 in contact with the tunnel dielectric film 322, and a block dielectric film 320 in contact with the charge storage layer 321.

In other words, the charge storage layer 321 is formed around the side surface of the pillar portion CLmn. Each word line WLmn is formed around the side surface of the pillar portion CLmn and the charge storage layer 321. Moreover, each word line WLmn is divided by the pillar portions CLmn adjacent in the column direction.

The drain-side select gate line SGDm is provided on the top of the uppermost word line WLmn. The drain-side select gate line SGDm extends parallel to the row direction. As shown in FIG. 17, the drain-side select gate lines SGDm are formed in a line-and-space manner so that these lines are isolated from one another at first intervals D1 or alternately at second intervals D2 (D2>D1) in the column direction. The drain-side select gate lines SGDm are formed at the second intervals D2 so that the later-described source-side select gate line SGSm is sandwiched therebetween. Further, the columnar portion CLmn is formed through the center of the drain-side select gate line SGDm in the column direction. As shown in FIG. 18, a gate dielectric film GD is formed between the drain-side select gate line SGDm and the columnar portion CLmn.

The source-side select gate line SGSm is provided on the top of the uppermost word line WLmn. The source-side select gate line SGSm extends parallel to the row direction. The source-side select gate lines SGSm are formed in a line-and-space manner so that these lines are isolated from one another at the first intervals D1 or alternately at the second intervals D2 in the column direction. The source-side select gate lines SGSm are formed at the second intervals D2 so that the drain-side select gate line SGDm is sandwiched therebetween. Further, the columnar portion CLmn is formed through the center of the source-side select gate line SGSm in the column direction. As shown in FIG. 18, the gate dielectric film GD is formed between the source-side select gate line SGSm and the pillar portion CLmn.

In other words, two drain-side select gate lines SGDm and two source-side select gate lines SGSm are alternately formed at the first intervals D1 in the column direction. Further, each drain-side select gate line SGDm and each source-side select gate line SGSm are formed around the columnar portion CLmn and the gate dielectric film GD. Moreover, each drain-side select gate line SGDm and each source-side select gate line SGSm are divided by the pillar portions CLmn adjacent in the column direction.

The back gate line BG is formed to two-dimensionally expand in the row direction and the column direction in a state covering the lower parts of the junctions JPmn. As shown in FIG. 18, the above-mentioned ONO layer NL is formed between the back gate line BG and the junction JPmn.

Furthermore, as shown in FIG. 17, a source line SLn is formed on the upper ends of the pillar portions CLmn of the U-shaped semiconductors SCmn adjacent in the column direction.

Still further, via plug lines PLmn, bit lines BLn are formed on the upper ends of the pillar portions CLmn extending above the drain-side select gate line SGDm. Each bit line BLn is formed above the source line SLn. The bit lines BLn extend in the column direction at predetermined intervals in the row direction, and are formed in the line-and-space manner.

The above-mentioned memory film 124, 224 is applied to the memory film 324 in the structure of such a collectively processed three-dimensional stack memory. That is, the charge storage layer 121 can be applied to the charge storage layer 321, or the tunnel dielectric film 222 can be applied to the tunnel dielectric film 322.

Moreover, as described above, the present invention is applied to the case where the memory hole is tapered so that its diameter is smaller on the lower side and greater on the upper side in the NAND string of the collectively processed three-dimensional stack memory. In this case, the degree of the hole diameter difference between the lower side and upper side of the memory hole does not matter to the present invention. That is, even if the memory hole is only slightly tapered, the present invention is applicable and provides its effects.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor memory device comprising:
a semiconductor substrate;

a first select transistor formed on the semiconductor substrate;
memory cell transistors stacked on the first select transistor and connected in series; and
a second select transistor formed on the memory cell transistors,
wherein the memory cell transistors include:
  a tapered semiconductor pillar which increases in diameter from a first side of the semiconductor pillar near the first select transistor toward a second side of the semiconductor pillar near the second select transistor,
  a tunnel dielectric film formed on a side surface of the semiconductor pillar,
  a charge storage layer formed on a side surface of the tunnel dielectric film and including a silicon nitrogen-containing film which
    increases in a composition ratio of silicon from a first side of the silicon nitrogen-containing film near the first select transistor toward a second side of the silicon nitrogen-containing film near the second select transistor, and
    contains a silicon nitride film as a main component,
  a block dielectric film formed on a side surface of the charge storage layer, and
  conductor films which are formed on a side surface of the block dielectric film and which serve as gate electrodes.

2. The device according to claim 1, wherein a composition ratio N/Si between nitrogen and silicon in the silicon nitrogen-containing film is equal to a stoichiometric ratio on the first side of the silicon nitrogen-containing film, and is lower than the stoichiometric ratio on the second side of the silicon nitrogen-containing film.

3. The device according to claim 1, wherein a composition ratio N/Si between nitrogen and silicon in the silicon nitrogen-containing film is about 1.33 on the first side of the silicon nitrogen-containing film, and is less than about 1.33 and larger than or equal to about 1.2 on the second side of the silicon nitrogen-containing film.

4. A semiconductor memory device comprising:
a semiconductor substrate;
a first select transistor formed on the semiconductor substrate;
memory cell transistors stacked on the first select transistor and connected in series; and
a second select transistor formed on the memory cell transistors,
wherein the memory cell transistors include:
  a tapered semiconductor pillar which increases in diameter from a first side of the semiconductor pillar near the first select transistor toward a second side of the semiconductor pillar near the second select transistor,
  a tunnel dielectric film formed on a side surface of the semiconductor pillar,
  a charge storage layer formed on a side surface of the tunnel dielectric film and including:
    a silicon nitrogen-containing film which is formed on the side surface of the tunnel dielectric film and which contains a silicon nitride film as a main component, and
    a high-dielectric-constant dielectric film which is formed on a side surface of the silicon nitrogen-containing film and which increases in thickness from a first side of the dielectric film near the first select transistor toward a second side of the dielectric film near the second select transistor,
  a block dielectric film formed on a side surface of the charge storage layer, and
  conductor films which are formed on a side surface of the block dielectric film and which serve as gate electrodes.

5. The device according to claim 4, wherein the relative dielectric constant of the high-dielectric-constant dielectric film is 10 or more.

6. The device according to claim 4, wherein the high-dielectric-constant dielectric film includes a hafnia film.

7. A semiconductor memory device comprising:
a semiconductor substrate;
a first select transistor formed on the semiconductor substrate;
memory cell transistors stacked on the first select transistor and connected in series; and
a second select transistor formed on the memory cell transistors,
wherein the memory cell transistors include:
  a tapered semiconductor pillar which increases in diameter from a first side of the semiconductor pillar near the first select transistor toward a second side of the semiconductor pillar near the second select transistor,
  a tunnel dielectric film formed on a side surface of the semiconductor pillar,
  a charge storage layer formed on a side surface of the tunnel dielectric film and including a silicon nitrogen-containing film which
    includes nanocrystal being of a metal or silicon and increasing in existence density from a first side of the silicon nitrogen-containing film near the first select transistor toward a second side of the silicon nitrogen-containing film near the second select transistor, and
    contains a silicon nitride film as a main component,
  a block dielectric film formed on a side surface of the charge storage layer, and
  conductor films which are formed on a side surface of the block dielectric film and which serve as gate electrodes.

8. The device according to claim 7, wherein the metal is one of W, WN, Hf, Zr and Ti.

9. A semiconductor memory device comprising:
a semiconductor substrate;
a first select transistor formed on the semiconductor substrate;
memory cell transistors which are stacked on the first select transistor on the surface of the semiconductor substrate and which are connected in series; and
a second select transistor formed on the memory cell transistors,
wherein the memory cell transistors include:
  a tapered semiconductor pillar which increases in diameter from a first side of the semiconductor pillar near the first select transistor toward a second side of the semiconductor pillar near the second select transistor,
  a tunnel dielectric film formed on a side surface of the semiconductor pillar and including:
    a first dielectric film which is formed on the side surface of the semiconductor pillar, which contains a silicon oxide film as a main component,
    a second dielectric film which
      is formed on a side surface of the first dielectric film,
      increases in thickness from a first side of the second dielectric film near the first select transistor toward a second side of the second dielectric film near the second select transistor, and
contains a silicon nitride film as a main component, and
a third dielectric film which is formed on a side surface of the second dielectric film, which contains a silicon oxide film as a main component,
a charge storage layer formed on a side surface of the tunnel dielectric film,
a block dielectric film formed on a side surface of the charge storage layer, and
conductor films which are formed on a side surface of the block dielectric film and which serve as gate electrodes.

10. The device according to claim 9, wherein a composition ratio N/Si between nitrogen and silicon in the second dielectric film is equal to a stoichiometric ratio on the first side of the second dielectric film, and is lower than the stoichiometric ratio on the second side of the second dielectric film.

* * * * *